US007866372B2

(12) United States Patent
Slaughter

(10) Patent No.: US 7,866,372 B2
(45) Date of Patent: *Jan. 11, 2011

(54) METHOD OF MAKING A HEAT EXCHANGER CORE COMPONENT

(75) Inventor: Victor Blakemore Slaughter, Manchester, MO (US)

(73) Assignee: The Boeing Company, Chicago, IL (US)

( * ) Notice: Subject to any disclaimer, the term of this patent is extended or adjusted under 35 U.S.C. 154(b) by 338 days.

This patent is subject to a terminal disclaimer.

(21) Appl. No.: 11/643,377

(22) Filed: Dec. 20, 2006

(65) Prior Publication Data

US 2008/0149304 A1    Jun. 26, 2008

(51) Int. Cl.
*H05K 7/20*    (2006.01)
(52) U.S. Cl. ...................................... 165/80.2; 700/120
(58) Field of Classification Search ................ 165/80.2, 165/185; 361/704; 430/269; 700/120
See application file for complete search history.

(56) References Cited

U.S. PATENT DOCUMENTS

| | | | | |
|---|---|---|---|---|
| 5,746,844 A | * | 5/1998 | Sterett et al. ................. | 148/522 |
| 6,046,426 A | * | 4/2000 | Jeantette et al. ........ | 219/121.63 |
| 6,112,804 A | * | 9/2000 | Sachs et al. .................. | 164/348 |
| 6,122,564 A | * | 9/2000 | Koch et al. ................... | 700/123 |
| 6,391,251 B1 | * | 5/2002 | Keicher et al. ................. | 419/7 |
| 6,623,687 B1 | | 9/2003 | Gervasi | |
| 6,751,516 B1 | * | 6/2004 | Richardson ................. | 700/119 |
| 6,940,037 B1 | * | 9/2005 | Kovacevic et al. ..... | 219/121.64 |
| 2004/0191106 A1 | * | 9/2004 | O'Neill et al. ................. | 419/2 |
| 2005/0221150 A1 | * | 10/2005 | Revol .......................... | 429/38 |

FOREIGN PATENT DOCUMENTS

EP        1777479 A2    4/2007
WO    WO 2006/064202 A1    6/2006

OTHER PUBLICATIONS

Luo, L., et al, "Constructal approach and multi-scale components" Applied Thermal Engineering 27 (2007) 1708-1714.

* cited by examiner

*Primary Examiner*—Teresa J Walberg

(57) ABSTRACT

In an embodiment of the invention, there is provided a method of making a heat exchanger core component comprising the steps of generating a stereolithography file from design data, slicing the stereolithography file into two-dimensional patterns, repeating the two-dimensional patterns sequentially to produce a three-dimensional core component, and depositing at least one layer of a material having a high thermal conductivity onto a top surface of a base. In another embodiment there is provided a heat exchanger core component made by an embodiment of the method wherein the core component comprises a triply periodic design that is repeated in three dimensions.

12 Claims, 2 Drawing Sheets

METHOD OF MAKING A HEAT EXCHANGER CORE COMPONENT

BACKGROUND OF THE INVENTION

1) Field of the Invention

A method of making a heat exchanger core component is provided. More particularly, a method of making a compact heat exchanger core component by an additive process is provided.

2) Description of Related Art

Known heat exchangers are devices built for efficient heat transfer from one fluid to another, whether the fluids are separated by a solid wall so that they never mix, or the fluids are directly contacted. Heat exchangers are typically used in refrigeration, air conditioning, space heating, electricity generation, and chemical processing. Heat exchangers are of particular use in the aerospace and automobile industries. For efficiency, heat exchangers are designed to maximize the surface area of the wall between the two fluids, while minimizing resistance to fluid flow through the exchanger. The heat exchanger's performance can also be affected by the addition of fins or corrugations in one or both directions, which increase surface area and may channel fluid flow or induce turbulence. Optimized devices are known as compact heat exchangers. Compact heat exchangers are complex structures with delicate components. The nature of the compact heat exchanger drives the cost of manufacture and cost of quality to high levels. Known methods of manufacturing heat exchangers and compact heat exchangers involve complex assembly and difficult attachment, brazing, soldering, or welding operations of the various parts of the heat exchangers, including but not limited to, the core, the exterior, interfacing flanges, fins, and manifolds. Known heat exchangers are typically of a thin foil construction and require brazing or a similar process to connect the pieces together. The cost of manufacturing heat exchangers and compact heat exchangers using known methods is high due to the complex assembly operations and maintenance of tools to conduct the assembly operations.

In particular, the cost of known methods of manufacturing and assembly of heat exchanger core components is high. The manufacturing and assembly of heat exchanger core components are important because the core components increase the amount of exchanging surface area of the heat exchanger. It is critical that these core components be securely connected to a heat exchanger base, so that the heat exchanger can function properly and so that a continuous path is provided for heat energy to travel through the heat exchanger. Known methods of manufacturing and assembly of heat exchanger core components are costly, and there are problems with the core components not being adequately attached to the heat exchanger base. Moreover, the efficiency of compact heat exchangers using known methods of manufacturing is low, and known methods of manufacturing heat exchanger core components with additive metal processes require intensive finishing or full machining. Finally, the increased demands placed on modern electronic, laser, engine, and similar systems, places increased demands on the cooling systems, which support them, in the manufacturing of compact heat exchangers. Accordingly, there is a need for a method of making a heat exchanger core component that does not have the problems associated with known methods.

SUMMARY OF THE INVENTION

This need for a method of making a heat exchanger core component that does not have the problems associated with known methods, as well as a unique, nonobvious, and advantageous method, is satisfied. None of the known methods provides all of the numerous advantages discussed herein. Unlike known methods, an embodiment of the method of making a heat exchanger core component may provide one or more of the following advantages: reduced manufacturing cost and improved efficiency; allows the core component of a heat exchanger to be deposited seamlessly on the base of the heat exchanger and integrated with the base; provides a high surface area, low density, tailored core component; applies additive manufacturing techniques to grow heat exchanger and compact heat exchanger core components; provides a heat exchanger or compact heat exchanger core component with a high surface area and a good flow rate; the use of an additive process enables the use of more complex geometries in the heat exchanger assembly when needed; easily and simply grows or builds the heat exchanger or compact heat exchanger core components in one piece; eliminates complex assembly operations and maintenance of tools; provides the ability to manufacture complex monolithic structures as an alternative to brazing intense assemblies; uses the as-deposited surface finish on most faces of the heat exchanger core component; allows for customization of the core component or foam; and, does not require intensive finishing or full machining after the heat exchanger or compact heat exchanger core component is formed.

In an embodiment of the invention, there is provided a method of making a heat exchanger core component comprising the steps of: generating a stereolithography file from design data; slicing the stereolithography file into two-dimensional patterns; repeating the two-dimensional patterns sequentially to produce a three-dimensional core component; and, depositing at least one layer of a material having a high thermal conductivity onto a top surface of a base.

In another embodiment, there is provided a heat exchanger core component made by the embodiment of the method discussed above wherein the core component comprises a triply periodic design that is repeated in three dimensions.

BRIEF DESCRIPTION OF THE DRAWINGS

The foregoing and other advantages and features, and the manner in which the same are accomplished, will become more readily apparent upon consideration of the following detailed description taken in conjunction with the accompanying drawings which illustrate preferred and exemplary embodiments, but which are not necessarily drawn to scale, wherein.

DETAILED DESCRIPTION OF THE INVENTION

Embodiments of the invention now will be described more fully hereinafter with reference to the accompanying drawings, in which some, but not all embodiments of the invention are shown. Indeed, several different embodiments may be provided and should not be construed as limited to the embodiments set forth herein. Rather, these embodiments are provided so that this disclosure will be thorough and complete and will fully convey the scope of the invention to those skilled in the art. Like numbers refer to like elements throughout.

Figure 1:
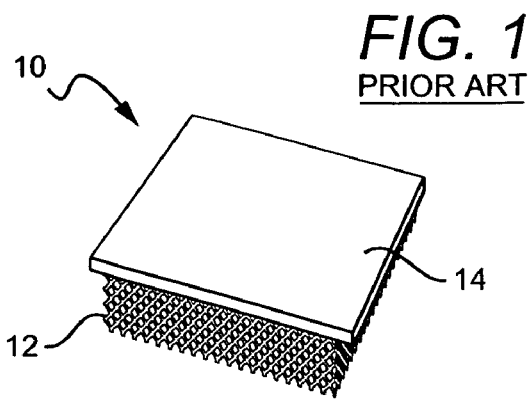
FIG. 1 is a perspective view of a prior art heat exchanger with a core component attached to a base manufactured and assembled via a conventional method.
Figure 2:
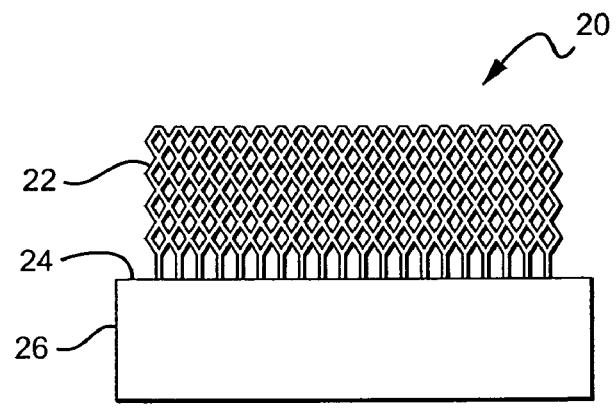
FIG. 2 is a front view of an embodiment of a heat exchanger with a core component deposited on a base using an embodiment of the method of the invention.
Figure 3:
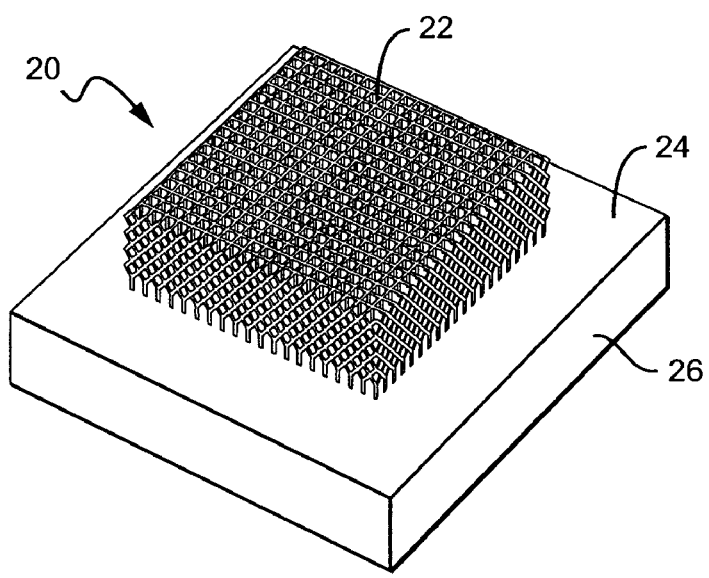
FIG. 3 is a perspective view of the embodiment of the heat exchanger shown in FIG. 2.
Figure 4:
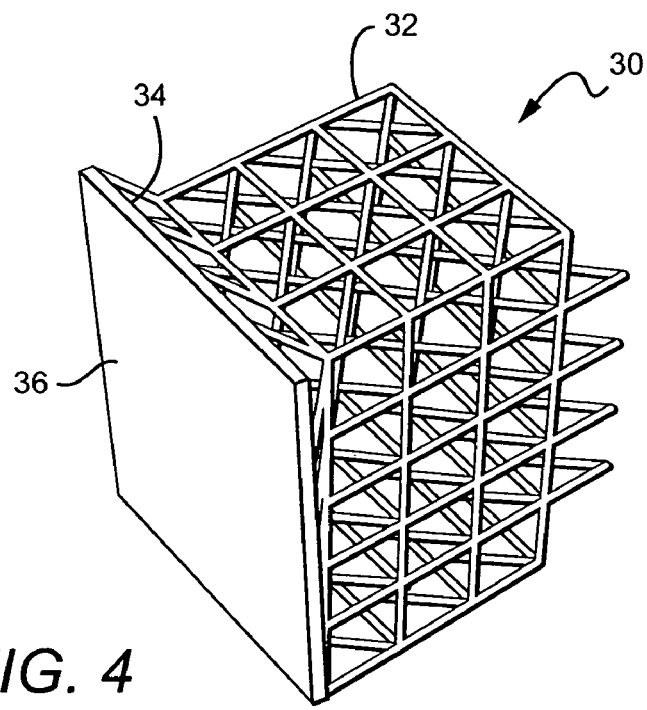
FIG. 4 is a perspective view of another embodiment of a heat exchanger with a core component deposited on a base using an embodiment of the method of the invention; and, FIG. 5 is a perspective view of another embodiment of a heat exchanger with a core component deposited on a base using an embodiment of the method of the invention.
Figure 5:
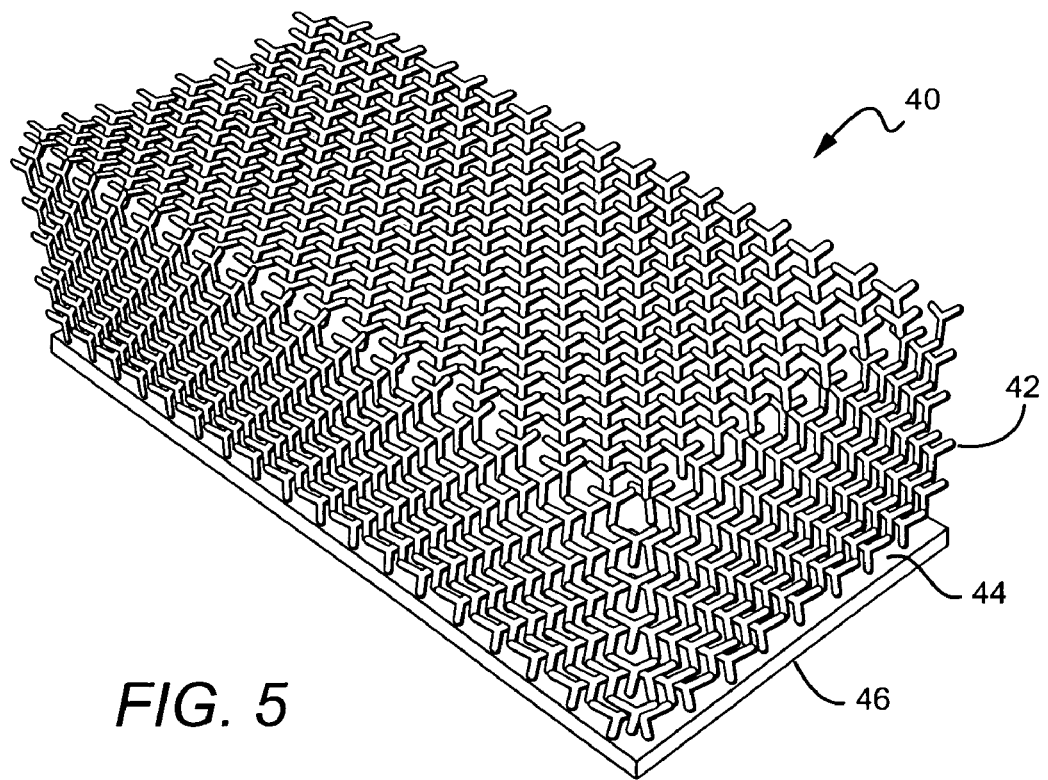

Referring now to the drawings, FIG. 1 is a perspective view of a prior art heat exchanger 10 with a core component 12 attached to a base 14 where the heat exchanger is manufactured and assembled via a conventional method. FIG. 2 is a front view of an embodiment of a heat exchanger 20 with a core component 22 deposited on a top surface 24 of a base 26 using an embodiment of the method of the invention. FIG. 3 is a perspective view of the embodiment of the heat exchanger 20 shown in FIG. 2. FIG. 4 is a perspective view of another embodiment of a heat exchanger 30 with a core component 32 deposited on a top surface 34 of a base 36 using an embodiment of the method of the invention. FIG. 5 is a perspective view of another embodiment of a heat exchanger 40 with a core component 42 deposited on a top surface 44 of a base 46 using an embodiment of the method of the invention.

In an embodiment of the invention, there is provided a method of making a heat exchanger core component. The embodiment of the method may be used to make a heat exchanger core component or a compact heat exchanger core component. Preferably, the method of making the heat exchanger core component is by an additive process, such as an additive deposition process or a metallic additive process. Preferably, the additive deposition process is a shape metal deposition process that may use an electron beam gun or a laser and a powdered metal, metal alloy or composite material. However, other suitable additive processes may be used. Preferably, the heat exchanger or compact heat exchanger is a plate heat exchanger composed of multiple, thin, slightly-separated plates that have large surface areas and fluid flow passages for heat transfer.

An embodiment of the method comprises the step of generating a stereolithography file from design data, such as computer aided design (CAD). Preferably, the core component has a solid modeled design. The embodiment of the method further comprises the step of slicing the stereolithography file into two-dimensional patterns. The embodiment of the method further comprises the step of repeating the two-dimensional patterns sequentially to produce a three-dimensional core component.

The embodiment of the method further comprises the step of depositing at least one layer of a material having a high thermal conductivity onto a top surface of a base. Preferably, the deposited material forms a pattern on the base, to form the three-dimensional core component. Preferably, the high thermal conductivity material is a metal, metal alloy, or foam material, such as carbon, titanium, silicon carbide, aluminum, vanadium, cobalt, chromium, copper, nickel, zinc, silicon nitride, boron carbide, boron nitride, hafnium carbide, and/or tungsten. More preferably, the material is a layered phase change foam that is metallic in form, such as a foam obtained from ERG Inc. of Oakland, Calif. However, other suitable high thermal conductivity materials may also be used. Preferably, the material has a thermal conductivity that is appropriate for the environmental and temperature conditions used in the embodiment of the method. Preferably, the thickness of the material layer deposited onto the base is in a range of about 0.001 inches thick to about 0.004 inches thick. The base may be comprised of the deposited material. Alternatively, the base is a substrate for the deposited material. Preferably, the base pattern is triply periodic in structure. Triply periodic structures or surfaces have by definition translational symmetries in three independent directions. This enables the core component to be tailored with features beneficial to the heat exchanger core component design. Preferably, the material is deposited seamlessly onto the base. In this embodiment of the method, the preferred deposition machine used is one such as the Arcam machine, model number EBM S12 system, obtained from Arcam AB of Sweden. However, other conventional deposition machines may also be used. The Arcam machine provides a free form fabrication technology for direct manufacturing of fully dense parts made of metal powder. The free form technology is based on electron beam melting, and parts are manufactured by melting metal powder and building up the parts layer by layer. Preferably, the material is a metal or metal alloy or composite such as carbon, titanium, aluminum, vanadium, cobalt, chromium, copper, nickel, and/or tungsten. More preferably, the material used is titanium 6Al4V 6 Aluminum 4 Vanadium. The material is uniformly deposited onto the substrate with a rake-like device that is part of the Arcam machine.

The embodiment of the method may further comprise the step after the depositing step of repeating the depositing step for each of a plurality of additional material layers. The embodiment of the method may further comprise the step, after the depositing step, of depositing material on the base to further form heat exchanger components such as a plate, an exterior, interfacing flanges, fins, and manifolds. The embodiment of the method may further comprise the step, before the depositing step, of heating the base with a heating component. Preferably, the heating component used to heat the base is an electron beam gun. However, the heating component may also comprise a laser or another suitable heating component. Preferably, the base is a substrate or start plate made of a metal or metal alloy such as titanium, aluminum, vanadium, cobalt, chromium, copper, nickel, tungsten, or another suitable metal or metal alloy. However, if the base is made of the deposited material, preferably, the deposited material is a metal, metal alloy, or foam material, such as carbon, titanium, silicon carbide, aluminum, vanadium, cobalt, chromium, copper, nickel, zinc, silicon nitride, boron carbide, boron nitride, hafnium carbide, and/or tungsten. Preferably, the thickness of the base may be between about one-quarter inch to about two inches. However, other suitable thicknesses may also be used. Preferably, the depth and width of the base or substrate are both less than eight inches. However, typically, the size and dimension of the base or substrate is dependent on the predetermined heat exchanger to be grown and obtained. The base or substrate are first designed in a three-dimensional CAD (computer aided design) program. The program file is then transferred to a pre-processing software where the model is sliced into thin layers. Preferably, the pre-processing software used is a software such as Magics RP obtained from Materialise of Belgium. Preferably, the base or substrate is heated to a first temperature in the range of about 650 degrees Celsius to about 750 degrees Celsius. However, the heat of the first temperature may be dependent on the material being deposited, and another suitable first temperature may be used.

The embodiment of the method may further comprise the step of melting the high thermal conductivity material layer at a second temperature with a heating component to grow the heat exchanger or compact heat exchanger. Preferably, the heating component used to melt the high thermal conductivity material is the same electron beam gun that is used to heat the base or substrate. However, the heating component may also comprise a laser or another suitable heating component. The electron beam gun may be a part of the Arcam machine. The electron beam gun is preferably used in a vacuum chamber which provides a high power process and a good environment, resulting in superior material characteristics. A vacuum chamber is preferred so that the electrons have a clear path to the metal. Further, the vacuum provides a good thermal environment, leading to good form stability and controlled thermal balance in the part. Preferably, the vacuum chamber or build chamber is about 250 millimeters long, by 250 millimeters wide, by 250 millimeters high. However, the vacuum chamber may also be larger in size. Preferably, the second temperature is greater than 2000 degrees Celsius and is at a heat suitable for melting the metal or metal alloy layer.

The heat exchanger core component or compact heat exchanger core component formed from the embodiment of the method does not require assembly of separate pieces. In manufacturing conventional heat exchangers, the assembly of separate pieces typically comprises the processes of brazing, soldering, or welding the separate pieces together, and these types of assembly processes are not necessary to form the heat exchanger core component or compact heat exchanger core component of the embodiment of the method. A single piece or single unit heat exchanger core component or compact heat exchanger core component is easier to build or grow, less costly to manufacture, and more efficient than conventional methods of building heat exchanger core component.

The embodiment of the method may further comprise the step after a final depositing step of cooling the heat exchanger core component if heat is used with the embodiment of the method. The formed heat exchanger core component or compact heat exchanger core component may be cooled with helium, argon, or another suitable cooling agent for an effective period of time. Preferably, the time to complete the steps of the method for making a one-layer compact heat exchanger core component is less than several minutes. However, the time to make the heat exchanger core component or compact heat exchanger core component depends on the size of the heat exchanger core component or compact heat exchanger core component desired. The larger the heat exchanger core component or compact heat exchanger core component desired, the longer the time to make the heat exchanger core component or compact heat exchanger core component. The smaller the heat exchanger core component or compact heat exchanger core component, the shorter the time to make the heat exchanger core component or compact heat exchanger core component. In addition, as discussed above, an embodiment of the method may comprise the step of depositing material to further form heat exchanger or compact heat exchanger components such as a plate, an exterior, interfacing flanges, fins, and manifolds. With the embodiment of the method there is no separate assembly required to connect the core to the exterior of the heat exchanger. Preferably, the heat exchanger core component or compact heat exchanger core component formed has an acceptable surface roughness and resolution. The finer the layer of material, the better the surface resolution of the heat exchanger core component or compact heat exchanger core component formed. The heat exchanger core component or compact heat exchanger core component may be finished upon completion of the build.

In another embodiment, there is provided a heat exchanger core component made by the method discussed above wherein the core component comprises a triply periodic design that is repeated in three dimensions. Preferably, the core component is comprised of a metal with high thermal conductivity. Preferably, the core component has a solid modeled design. It is important that the heat exchanger core component formed be securely attached or seamlessly attached to the base or substrate in the manufacture and assembly of the heat exchanger core component. For optimum functionality, the core component preferably has a continuous path for heat energy to travel through the heat exchanger. This is accomplished by designing a triply periodic structure, which is then repeated in three directions. This enables the core component to be tailored with features beneficial to the heat exchanger core component design.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed that modifications and other embodiments are intended to be included within the scope of the appended claims. Although specific terms are employed herein, they are used in a generic and descriptive sense only and not for purposes of limitation.

What is claimed is:

1. A method of making a single piece heat exchanger core component comprising the steps of:
generating a stereolithography file from design data;
slicing the stereolithography file into two-dimensional patterns;
repeating the two-dimensional patterns sequentially;
heating a base with an electron beam gun;
forming a single piece three-dimensional heat exchanger core component by depositing via electron beam deposition a plurality of layers of a material having a high thermal conductivity onto a top surface of the base, wherein the heat exchanger core component does not require separate assembly to heat exchanger components including
a plate, an exterior, interfacing flanges, and fins; and,
cooling the single piece three-dimensional heat exchanger core component with a cooling agent after all of the plurality of layers have been deposited and the heat exchanger core component has been formed.

2. The method of claim 1 wherein the deposited material forms a pattern on the base, to form the three-dimensional heat exchanger core component, 3. The method of claim 2 wherein the base pattern is triply periodic.

4. The method of claim 1 further comprising the step, after the forming step, of melting the plurality of layers of the high thermal conductivity material with the electron beam gun.

5. The method of claim 1 wherein the base is comprised of the deposited material.

6. The method of claim 1 wherein the base is a substrate for the deposited material.

7. The method of claim 1 wherein the material is deposited seamlessly on the base.

8. The method of claim 1 wherein the material is selected from the group consisting essentially of carbon, titanium, silicon carbide, aluminum, vanadium, cobalt, chromium, copper, nickel, zinc, silicon nitride, boron carbide, boron nitride, hafnium carbide, and/or tungsten.

9. A method of making a single piece heat exchanger core component by an electron beam deposition process, the method comprising the steps of:
    generating a stereolithography file from design data;
    slicing the stereolithography file into two-dimensional patterns;
    repeating the two-dimensional patterns sequentially;
    heating a base with an electron beam gun;
    forming a single piece three-dimensional heat exchanger core component by depositing via electron beam deposition a plurality of layers of a material having a high thermal conductivity onto a top surface of the base, wherein the deposited material forms a triply periodic pattern on the base, and the three-dimensional heat exchanger core component does not require separate assembly to heat exchanger components including a plate, an exterior, interfacing flanges, and fins;
    melting each of the plurality of layers of high thermal conductivity material with the electron beam gun; and,
    cooling the single piece three-dimensional heat exchanger core component with a cooling agent after all of the plurality of layers have been deposited and the heat exchanger core component has been formed.

10. The method of claim 9 wherein the base is comprised of the deposited material.

11. The method of claim 9 wherein the base is a substrate for the deposited material.

12. The method of claim 9 wherein the material is selected from the group consisting essentially of carbon, titanium, aluminum, vanadium, cobalt, chromium, copper, nickel, and tungsten.

* * * * *